United States Patent [19]
Tiemann

[11] 4,450,408
[45] May 22, 1984

[54] LOW LOSS WIDE BAND FRONT END FOR NMR RECEIVER

[75] Inventor: Jerome J. Tiemann, Schenectady, N.Y.

[73] Assignee: General Electric Company, Schenectady, N.Y.

[21] Appl. No.: 329,791

[22] Filed: Dec. 11, 1981

[51] Int. Cl.³ .......................................... G01R 33/08
[52] U.S. Cl. .................................... 324/318; 324/322
[58] Field of Search ........................ 324/300, 318, 322

[56] References Cited
U.S. PATENT DOCUMENTS

| | | | |
|---|---|---|---|
| 3,858,112 | 12/1974 | Satoh et al. | 324/0.5 R |
| 4,075,552 | 1/1978 | Traficante et al. | 324/0.5 AH |
| 4,129,822 | 12/1978 | Traficante | 324/0.5 AH |

*Primary Examiner*—Michael J. Tokar

*Attorney, Agent, or Firm*—Lawrence D. Cutter; James C. Davis, Jr.; Marvin Snyder

[57] ABSTRACT

An inductive element of a multipole impedance transforming bandpass network of classical design such as Butterworth or Chebyshev, for example, is employed as a pick-up coil for sensing NMR signals. The network matches the high input impedance of an NMR receiver preamplifier to the low impedance of the pick-up coil. Simultaneously, and as a consequence of the impedance matching, the high preamplifier input impedance appears as a band width broadening element at the pick-up coil. By virtue of the multipole design of transformer, a bandwidth broader than the natural bandwidth of the pick-up coil is obtained and the transfer of the energy of the detected NMR signal to the preamplifier is maximized.

6 Claims, 5 Drawing Figures

LOW LOSS WIDE BAND FRONT END FOR NMR RECEIVER

BACKGROUND OF THE INVENTION

This invention relates to nuclear magnetic resonance (NMR) apparatus and more specifically to a combined NMR signal pickup probe and low loss, wide band front end for an NMR receiver.

Nuclear magnetic resonance occurs in atomic nuclei having an odd number of protons and/or neutrons. Such nuclei have a net magnetic moment and precess or rotate when a magnetic field force is applied, and the spin axis of the nucleus is made non-parallel to the field. The rate at which the nuclei precess is dependent on the strength of the applied field and the characteristics of the nuclei. The angular frequency of precession, $\omega$, is defined as the Larmor frequency and is given by the equation $\omega = \gamma H$, in which $\gamma$ is the gyromagnetic ratio (constant for each type of nucleus) and H is the strength of the uniform magnetic field. A precessing nucleus is capable of absorbing electromagnetic radiation at the Larmor frequency $\omega$. The absorbed energy may be reradiated as an NMR signal, and upon detection analyzed to yield useful information about the material such as its structure, diffusion properties of molecules, and the relative abundance of the material or, in the case of a nonuniform field, information concerning the physical location of the radiating nuclei can be obtained. With proper excitation, detection and reconstruction techniques, the reradiated NMR signals provide sufficient information to construct cross-sectional images of various bodily organs or even cross sections of the entire torso or head. Such images are useful for medical diagnostic purposes. Imaging methods employing NMR offer significant advantages over conventional imaging methods which use ionizing radiation. An exemplary NMR imaging method is described and claimed in allowed application Ser. No. 067,697, filed Aug. 20, 1979 by R. S. Likes, and which has now issued as U.S. Pat. No. 4,307,343, on Dec. 2, 1981, and which is assigned to the same assignee as the present invention.

Since the effective signal-to-noise ratio of the NMR signal can be improved by averaging, there is a trade-off between signal-to-noise ratio and the time required to gather data. However, since the data needed for NMR imaging requires a patient to remain immobilized while it is being collected, it is desirable to minimize the actual data collection time, and it is therefore desirable to maximize the signal-to-noise ratio in every possible way.

The signal-to-noise ratio is generally improved by frequent excitation of the nuclear magnetic dipoles and by maximizing the efficiency of the NMR receiver over the entire frequency band in which they are radiating. Since this frequency spectrum is broadened by the magnetic field gradients which are present in NMR systems, it is usally much broader than the natural bandwidth of conventional pick-up coils (probes). If, in fact, it is desirable to distinguish the NMR signals arising from different spatial positions on the basis of their respective resonant frequencies, it is necessary to apply a magnetic field gradient of sufficient strength to spread out the signal spectrum by a factor of N as compared to the natural frequency of the NMR signal in a homogeneous field (N being the number of image points (pixels) to be resolved in the image). Thus, when many hundreds or thousands of pixels are involved, the signal must be much broader in frequency than the natural bandwidth of conventional probes.

Although it is possible to achieve a broad bandwidth in a conventional probe by applying a dampening resistance, this approach degrades the signal-to-noise ratio. If an efficient probe having a narrow frequency response is used, however, its resonant frequency would have to be swept across the band of interest, and this would add to the time required to collect the data.

In discussing the concept of bandwidth, the operational consideration is the loss of energy that occurs when the signal is outside of the band, and as mentioned above, whatever losses occur can be made up for by increasing the data collection time. Thus, a practical definition of bandwidth is that all frequencies within the band can be sensed with the required sensitivity without increasing the data collection time by an appreciable fraction such as, for example, 10 percent. Thus, the bandwidth of a probe can be operationally defined as the frequency region over which its sensitivity is greater than 90 percent of the ideal sensitivity.

The present invention provides the desired broadband sensitivity without requiring additional dampening resistances. The invention also provides the added benefit of matching the effective pick-up coil impedance to the receiver preamplifier input impedance in an optimum manner. In this fashion, the maximum possible amount of signal energy is transferred to the preamplifier input impedance while providing uniform sensitivity over a larger bandwidth. Briefly, the approach is to consider the pick-up coil as one of the inductances in a multipole impedance transforming bandpass network of one of the classical filter designs such as Butterworth, Chebychev, or Elliptic, for example.

SUMMARY OF THE INVENTION

The inventive low loss, wide band front end for detecting and coupling NMR signal energy to a preamplifier of NMR imaging receiver is made up of a multipole, impedance transforming bandpass network having at least two sets of coupled resonant circuits formed of inductive and capacitive elements. The inductive elements in a first set of the resonant circuits functions simultaneously as a pick-up coil to detect the NMR signals, and as an element of the multipole, impedance transforming bandpass network. The second set of resonant circuit operates to transform the preamplifier impedance to an impedance level which matches the combined resistance of the inductive elements of the first set more closely than the untransformed preamplifier input impedance. The transformed impedance level appears in parallel with the first set of resonant circuits and operates to broaden the signal bandwidth thereof.

It is an object of this invention to provide a low loss, wide band front end for an NMR receiver.

It is another object of the invention to provide an NMR imaging receiver with a low loss, wide band front end which provides a broadband sensitivity without requiring additional dampening resistances.

It is still another object of the invention to provide a multipole, impedance transforming bandpass input network for an NMR imaging receiver, for transferring maximum amount of signal energy to the receiver preamplifier input impedance.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings.

DETAILED DESCRIPTION OF THE INVENTION

Figure 1A:
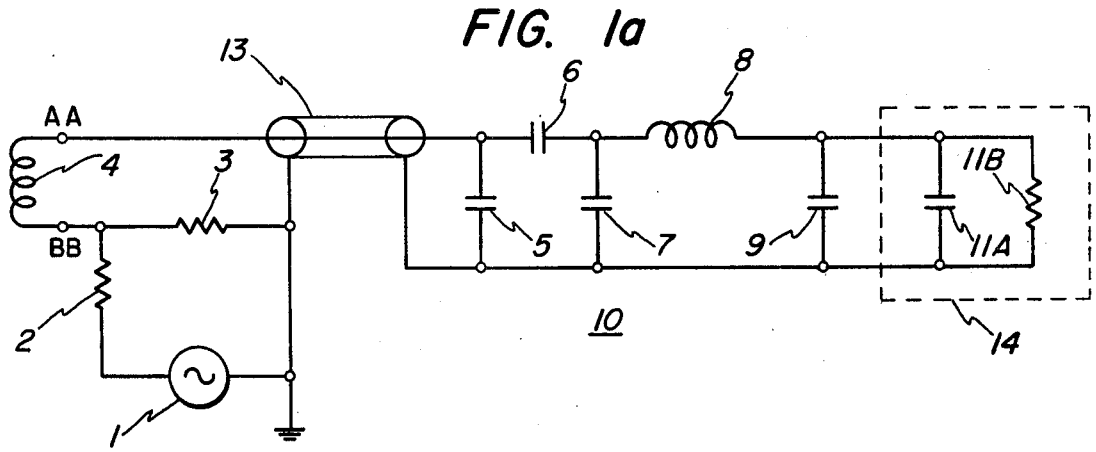
FIG. 1a is a schematic diagram illustrating an embodiment of the inventive low loss, wide band front end for an NMR imaging receiver.

FIG. 1a is a schematic illustration of an embodiment of the inventive low loss, wide band front end for an NMR imaging receiver. The circuit, generally designated 10, is a multipole impedance transforming bandpass network of classical design such as Butterworth or Chebychev. The network is made up of an inductor 4 connected at one end through shielded conductor 13 to capacitor 5 and at its other end to ground through a resistor 3 representing the ohmic resistance of inductor 4. The inductor end having capacitor 5 connected thereto, is also coupled through capacitor 6 to a capacitor 7 and to one end of a second inductor 8. Inductor 8 is connected at its other end to capacitor 9 and the input of partially shown preamplifier 14 whose admittance is represented by an equivalent susceptance 11A and conductance 11B. The free ends of susceptance 11A, conductance 11B, and capacitors 5, 7, and 9 are connected to the grounded shield of conductor 13. FIG. 1 also shows NMR signal source 1 and associated series source resistance 2 connected across resistor 3. Signal source 1 is a schematic representation of the reradiated NMR signal, while resistance 2 is a representation of the resistance associated with, for example, body tissue in the case of NMR imaging of a live subject.

Inductor 4 functions as an NMR signal pick-up coil and depending on the operating frequency (typically 4–5 MHz) may be approximately 1 foot in diameter and have 2–3 turns. The exact number of turns will depend on the effect of distributed capacitance 5 associated with shielded conductor 13 and any Faraday shields (not shown) employed to reduce noise, on the resonant frequency of inductor 4 and capacitor 5. Although a major portion of the capacitance of capacitor 5 will be associated with shielded conductor 13 and inductor 4, a small fraction of this capacitance may be provided as a discrete element in order to provide a uniform and predictable total capacitance. It is generally desirable to reduce the values of resistor 3 and capacitor 5 and increase the inductance value of inductor 4 to maximize NMR signal detection.

Although inductor 4 electrically constitutes part of impedance transforming network 10, it may actually be, and typically is, situated remotely therefrom near NMR signal source 1 (which may be a patient in an adjacent room) where it simultaneously functions as an NMR signal pick-up probe (as will be described more fully hereinafter).

Figure 1B:
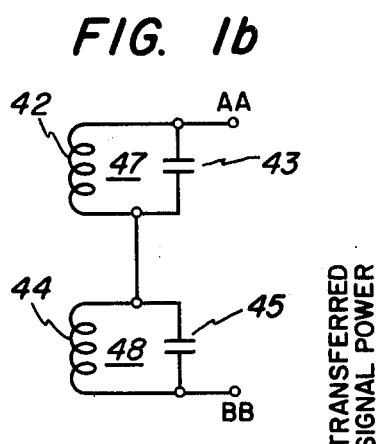
FIG. 1b depicts a probe configuration useful with the inventive circuit shown in FIG. 1a in which the first set of resonant circuit contains two resonant circuits.

FIG. 1b illustrates an alternative inventive probe configuration in which inductor 4 is replaced by a set of, for example, two series-connected parallel resonant circuits 47 and 48. Resonant circuit 47 comprises parallel-connected inductor 42 and capacitor 43, while resonant circuit 48 is made up of parallel-connected inductor 44 and capacitor 45. The probe shown in FIG. 1c would be connected to circuit 10 of FIG. 1a at corresponding points AA and BB.

Figure 1C:
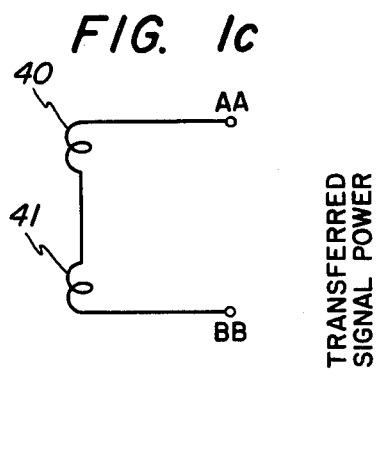
FIG. 1c illustrates an alternative, exemplary probe configuration useful with the inventive circuit shown in FIG. 1a in which the pick-up coil comprises two inductive elements.

In practice, inductor 4 may comprise a set of inductive elements, such as series-connected elements 40 and 41 shown in FIG. 1c. Inductive elements 40–41 may be disposed about the regions to be imaged with the objective of maximizing the uniformity of the coupling to the NMR signals which are generated throughout the region. Points AA and BB of inductive elements 40 and 41 are connected to similarly identified points of circuit 10 in FIG. 1. It should be noted that the embodiment shown in FIG. 1c is exemplary and that the number of inductive elements need not be limited to two.

The function of circuit 10 is to match the impedance of pick-up coil 4 (typically $\simeq 0.4\Omega$) to the high input preamplifier impedance (typically $\simeq 100$ K$\Omega$). Impedance matching ensures maximum transfer of NMR signal energy from pick-up coil 4 to the preamplifier. NMR signal losses in pickup coil 4 itself must also be held low. In order for the combination of pick-up coil 4, capacitor 5, and resistor 3 to have low loss, the combination must have a very high quality factor (Q). For this to occur, the Q factor of pick coil 4 must be high, but at resonance the natural bandwidth of a high Q pick-up coil will be too narrow for NMR imaging applications.

Since the Q of a coil may be generally defined as $Q=X/R$, where X is the coil reactance in ohms and R is the series resistance in ohms, wider bandwidth (lower Q) may be obtained by increasing R (resistor 3, FIG. 1). Alternatively, wider bandwidth may be obtained by decreasing the reactive inductance, X, while increasing capacitance of capacitor 5 (to maintain resonance). Both of these approaches are, however, unsatisfactory for NMR imaging applications because they result in undesirable NMR signal energy dissipation in the pick-up coil and do not act to dissipate maximum energy in the preamplifier impedance.

The pick-up coil bandwidth and transfer of NMR signal energy is maximized by causing the preamplifier input impedance to appear as a loss element at an impedance level similar to that of the pick-up coil 4. This effect is obtained by impedance transformation, wherein the high resistance corresponding to the real part of the high preamplifier admittance is transformed to a resistance across capacitor 5. The real part of the transformed admittance appearing as a loss element in parallel with capacitor 5 effectively acts to lower the Q of pick-up coil and thereby widens the bandwidth. In this manner, NMR signal energy at pick-up coil 4 is dissipated in the preamplifier, rather than in a damping resistance that would otherwise be needed to broaden pick-up coil bandwidth.

Transformation of the high resistance corresponding to the real part of preamplifier input admittance to a resistance in parallel with capacitor 5 to match pick-up coil 4 impedance of approximately 0.4$\Omega$, occurs through a π section made up of inductor 8 and capacitors 7 and 9 connected to each end thereof. The π section transforms the high resistance to a lower value of which is then coupled across capacitor 6, placing it in parallel with capacitor 5.

TABLE

| Component | Operating Frequency | | | | | |
|---|---|---|---|---|---|---|
| | 4 MHz | | | 5 MHz | | |
| Resistor 3 (ohms) | 0.4 | 0.4 | 0.4 | 0.4 | 0.4 | 0.4 |
| Resistor 11 (ohms) | 100K | 100K | 100K | 100K | 100K | 100K |
| Inductor 4 (H) | 1 | 2 | 5 | 1 | 2 | 5 |
| Capacitor 5 (pf) | 1563 | 759 | 292.4 | 1000 | 487 | 185.5 |
| Inductor 8 (H) | 75 | 107.5 | 128 | 60 | 75 | 97 |
| Capacitor 9 (pf) | 25 | 16 | 13 | 20 | 16 | 11 |
| Capacitor 6 (pf) | 22 | 24 | 25 | 13 | 13 | 16 |
| Capacitor 7 (pf) | 115 | 144 | 195 | 90 | 115 | 155 |
| Bandwidth (KHz) | 100 | 100 | 100 | 110 | 100 | 125 |

Capacitor values are in picofarads, and inductor values are in microhenries.

The Table summarizes resistor, inductor, and capacitor values of network 10 useful at NMR signal frequencies of 4 MHz and 5 MHz. The indicated values provide the desired bandwidth and impedance matching. The component values are merely exemplary and solution of equations describing the frequency response of network 10 will yield other suitable values. In solving the equations, convenient component values may be arbitrarily assigned to some elements and the equations solved for the "unknown" values. Values of pick-up coil impedance (resistor 3) and preamplifier input impedance may be ascertained beforehand, provided the operating frequency has been selected. As is evident from the Table, the inventive circuit exhibits bandwidths in the range of 100 KHz to 125 KHz.

Figure 2A:
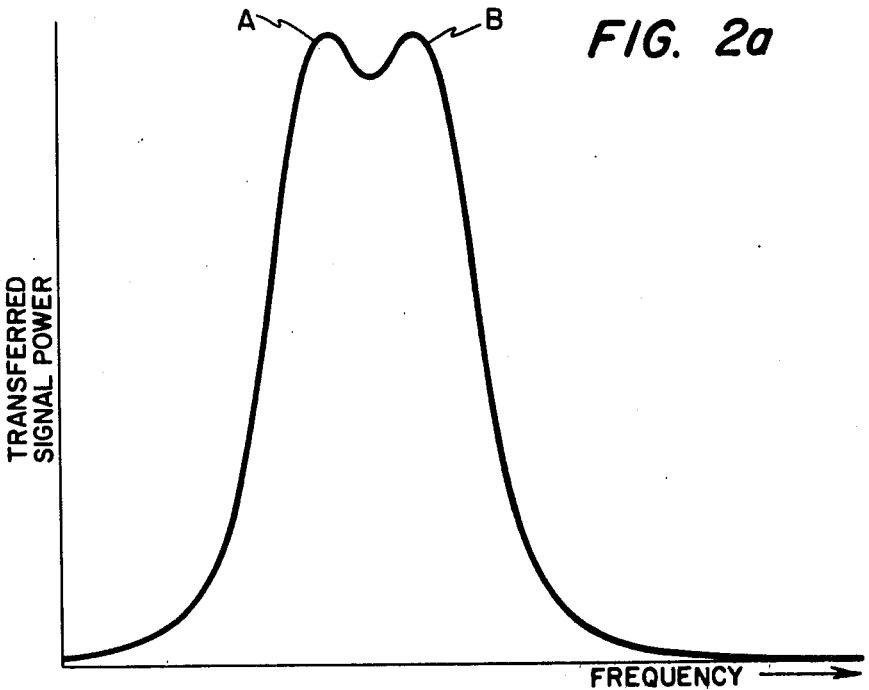
FIG. 2a depicts the frequency response of one exemplary embodiment of the inventive circuit.
Figure 2B:
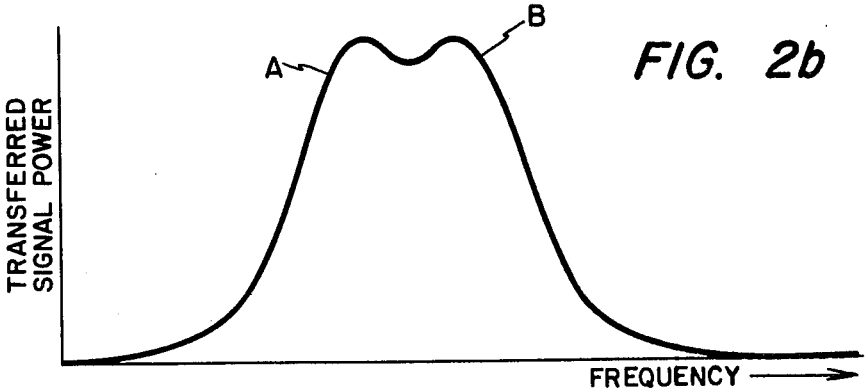
FIG. 2b illustrates the frequency response of another embodiment of the inventive circuit.

FIG. 2a illustrates the frequency response of an embodiment of impedance matching bandpass network 10 shown in FIG. 1, wherein various component values are as indicated in the Table in the first column under the operating frequency of 5 MHz. The bandwidth obtained with this embodiment is 110 KHz. The frequency response of another embodiment employing component values shown in the third column under the operating frequency of 5 MHz is depicted in FIG. 2b. The dual resonance peaks (A and B) in FIGS. 2a and 2b are the result of combined responses due to the best possible impedance matching and to the best possible tuning. Alternatively, the dual resonance peaks may be attributed to the two resonant circuits in network 10, which are coupled by capacitor 6. One of the resonant circuits is composed of inductor 4 and capacitor 5, the other resonant circuit being made up of inductor 8 and capacitors 7 and 9. Although there are two resonant networks and a dual resonance response is obtained (peaks A and B in each of FIGS. 2a and 2b), there is no recognizable correspondence of resonant peak and resonant network due to the highly interactive nature of circuit 10.

The present invention thus constitutes a low loss, wide band front end for NMR imaging receivers in which one of the inductive elements operates simultaneously as an element of an impedance transforming network and as an NMR signal pick-up probe. The circuit is an integral pick-up coil impedance matching network, rather than, as in the conventional approach, a separate tuned signal pick-up probe, followed by a matching network. The inventive network performs simultaneous dual functions: it operates to match high preamplifier input impedance to the low pick-up coil impedance and as a result the high resistance of the preamplifier input admittance appears as a bandwidth broadening element at the pick-up coil.

The invention as described hereinabove is applicable to not only Butterworth and Chebychev filter configurations but to other configurations such as, for example, Elliptic and the Butterworth-Thompson family of filters.

It is apparent from the foregoing that the present invention provides a low loss, wide band front end for an NMR receiver. Broadband sensitivity is obtained without requiring additional dampening resistances. The inventive circuit is a multipole, impedance transforming bandpass input network which transfers maximum possible amount of signal energy to the receiver preamplifier input impedance.

While certain preferred features of the invention have been shown by way of illustration, many modifications and changes will occur to those skilled in the art. It is, therefore, to be understood that the appended claims are intended to cover all such modifications and changes as fall within the true spirit of the invention.

The invention claimed is:

1. A low loss, wide band front end for sensing and coupling an NMR signal to a preamplifier of an NMR imaging receiver comprising:
   a multi-pole impedance transforming bandpass network having first and second sets of coupled resonant circuits each formed by respective sets of inductive and capacitive elements, wherein the inductive elements in said first set of resonant circuits are operable simultaneously as a pick-up coil to sense said NMR signal and as operative elements of said multipole impedance transforming bandpass network; and wherein
   said second set of resonant circuits is operable to transform the input impedance of said preamplifier to an impedance level which matches the combined resistance of said first set of inductive elements in said first set of resonant circuits more closely than the untransformed input impedance of said preamplifier, wherein the transformed impedance level appears in parallel with said first set of resonant circuits and is operable to broaden the signal bandwidth thereof.

2. The low loss, wide band front end of claim 1 wherein the number of elements in said first set of inductive elements is one.

3. The low loss, wide band front end of claim 1 wherein the inductive elements of said first set of resonant circuits are operable as a pick-up coil to sense said NMR signals; said second set of resonant circuits being coupled to a preamplifier exhibiting a known admittance; and wherein said second set of resonant circuits operates to effectively cause the resistance corresponding to the real part of said preamplifier admittance to effectively appear as a dampening element in parallel with said first set of resonant circuits, said transformer resistance matching the combined resistance of said first set of inductive elements operative as a pick-up coil more closely than the resistance corresponding to the real part of said preamplifier admittance and acting to broaden the bandwidth of said first set of resonant circuits.

4. The low loss, wide band front end of claim 2 or 3 including a capacitor coupling said first and second sets of resonant circuits.

5. The low loss, wide band front end of claim 2 or 3 wherein said multipole, impedance transforming bandpass network comprises a Butterworth circuit.

6. The low loss, wide band front end of claim 2 or 3 wherein said multipole, impedance transforming bandpass network comprises a Chebyshev circuit.

* * * * *